(12) United States Patent
Shibata et al.

(10) Patent No.: US 10,727,155 B2
(45) Date of Patent: Jul. 28, 2020

(54) ELECTRONIC APPARATUS FOR COOLING HEATING ELEMENT

(71) Applicant: CANON KABUSHIKI KAISHA, Tokyo (JP)

(72) Inventors: Masayoshi Shibata, Kawasaki (JP); Keita Iwai, Kawasaki (JP); Hideki Kawashima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/415,130

(22) Filed: May 17, 2019

(65) Prior Publication Data

US 2019/0385927 A1 Dec. 19, 2019

(30) Foreign Application Priority Data

Jun. 19, 2018 (JP) ................. 2018-116290

(51) Int. Cl.
*H01L 23/40* (2006.01)
*H01L 23/467* (2006.01)
*H04N 5/225* (2006.01)

(52) U.S. Cl.
CPC ........ *H01L 23/4006* (2013.01); *H01L 23/467* (2013.01); *H04N 5/2252* (2013.01); *H04N 5/225251* (2018.08); *H01L 2023/4068* (2013.01); *H01L 2023/4087* (2013.01)

(58) Field of Classification Search
CPC ............... H01L 23/4006; H01L 23/467; H01L 2023/4087; H01L 2023/4068; H04N 5/2252; H04N 5/225251
See application file for complete search history.

(56) References Cited

U.S. PATENT DOCUMENTS 9,485,451 B2   11/2016   Kawamura
2006/0077637 A1*  4/2006  Ishikawa ................. G06F 1/203
                                                                 361/703
2009/0002549 A1*  1/2009  Kobayashi ........... H04N 5/2251
                                                                 348/374

FOREIGN PATENT DOCUMENTS

JP            6000752 B2    10/2016

* cited by examiner

*Primary Examiner* — Mekonnen D Dagnew
(74) *Attorney, Agent, or Firm* — Rossi, Kimms & McDowell LLP

(57) ABSTRACT

An electronic apparatus includes a board on which a heating element is mounted, a fan including a discharge port, a heat-exchange unit configured to receive air discharged from the discharge port of the fan and radiate heat and a heat-conductive unit configured to thermally couple the heating element and the heat-exchange unit. The heating element is placed as an extension of a discharging direction of the air from the fan with respect to the discharge port of the fan. The heat-exchange unit is placed between the heating element and the fan in a direction substantially parallel to the discharging direction.

12 Claims, 5 Drawing Sheets

ELECTRONIC APPARATUS FOR COOLING HEATING ELEMENT

BACKGROUND OF THE INVENTION

Field of the Invention

The present invention relates to an electronic apparatus for cooling a heating element.

Description of the Related Art

Typical electronic apparatuses require prevention of a rise in internal temperature. For example, in image pickup apparatuses, as the number of pixels and the frame rate increase in video shooting, it is important to prevent a temperature rise of a housing. In order to prevent the temperature rise inside an apparatus, JP 6000752 B2 discloses a structure in which a cooling fan and a heat sink are used as a forced cooling structure to cool a circuit board.

The downsizing of electronic apparatuses is highly required. However, the downsizing of a cooling structure such as a fan and a heat sink to downsize an apparatus deteriorates cooling effects. In a cooling structure using a fan, it is desirable to effectively design, for example, an inlet path linked to the fan, a heat-transfer path from a heat source to a heat-exchange unit such as a fin, a blowing path from the fan to the heat-exchange unit, and an exhaust path from the heat-exchange unit to the outside of a housing. However, it is difficult to achieve both the downsizing of an apparatus and the improvement of cooling efficiency. Therefore, electronic apparatuses leave room for securing a high cooling function without being enlarged.

SUMMARY OF THE INVENTION

The present invention provides efficient cooling in a space-saving manner.

Accordingly, the present invention provides an electronic apparatus including a board on which a heating element is mounted, a fan including a discharge port, a heat-exchange unit configured to receive air discharged from the discharge port of the fan and radiate heat and a heat-conductive unit configured to thermally couple the heating element and the heat-exchange unit, wherein the heating element is placed as an extension of a discharging direction of the air from the fan with respect to the discharge port of the fan, and the heat-exchange unit is placed between the heating element and the fan in a direction substantially parallel to the discharging direction.

According to the present invention, it enables efficient cooling in a space-saving manner.

Further features of the present invention will become apparent from the following description of exemplary embodiments (with reference to the attached drawings).

DESCRIPTION OF THE EMBODIMENTS

An embodiment of the present invention will now be described with reference to the drawings.

Figure 1A:
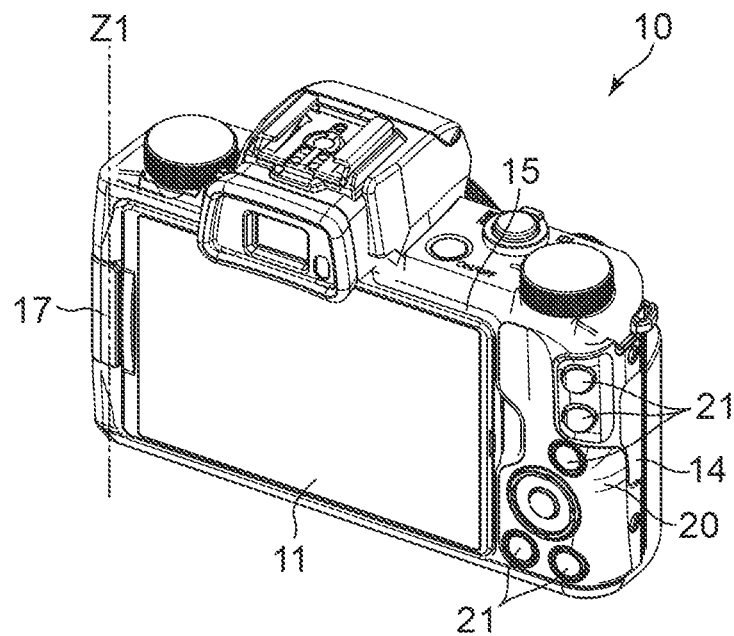
FIG. 1A is a perspective view of an image pickup apparatus with a liquid crystal LCD monitor being closed.
Figure 1B:
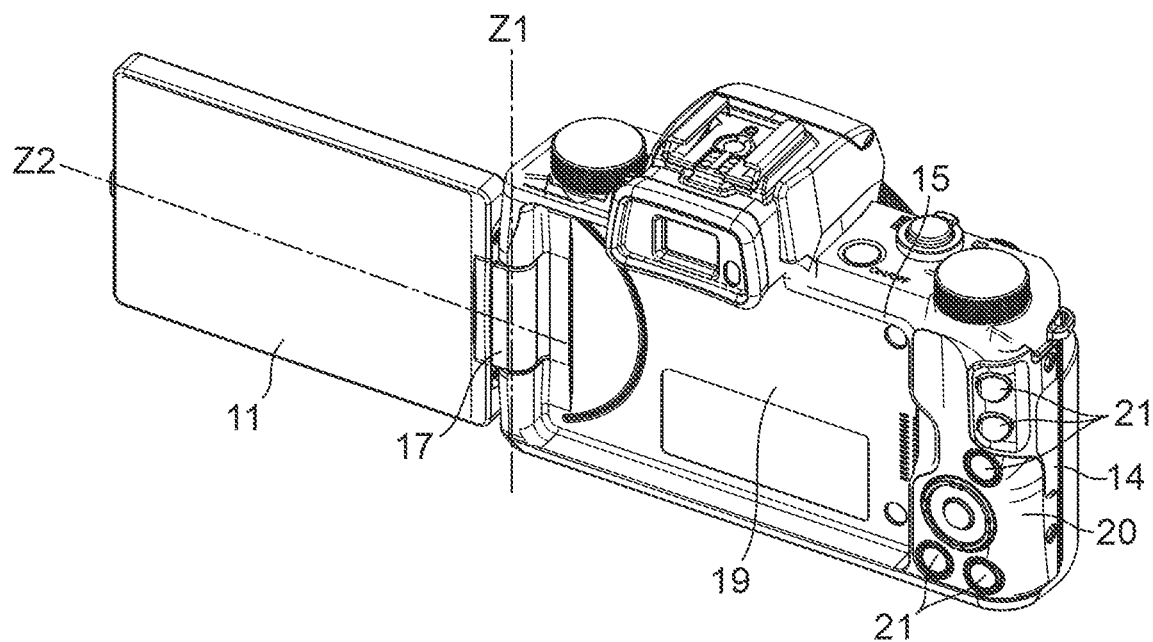
FIG. 1B is a perspective view of the image pickup apparatus with the LCD monitor being opened.

FIGS. 1A and 1B are perspective views of an electronic apparatus to which a cooling structure according to an embodiment of the present invention is applied. An image pickup apparatus 10 is illustrated as one of the examples of the electronic apparatus, but the present invention is not limited thereto. The image pickup apparatus 10 is, for example, a digital camera.

The image pickup apparatus 10 includes a LCD monitor (Liquid Crystal Monitor) 11 as a movable component which may be opened or closed. FIG. 1A is a perspective view of the rear side of the image pickup apparatus 10 with the LCD monitor 11 being closed. FIG. 1B is a perspective view of the rear side of the image pickup apparatus 10 with the LCD monitor 11 being opened. The image pickup apparatus 10 includes a lens barrel (not shown) that captures an object image into an image pickup device (not shown). A user of the image pickup apparatus 10 is able to confirm the object image through the LCD monitor 11.

The LCD monitor 11 is attached to a main body (electronic apparatus body) of the image pickup apparatus 10, being rotatable with two pivots (centering around the pivot Z1 and the pivot Z2) by a movable hinge 17. The main body of the image pickup apparatus 10 includes a rear cover 15 provided with a monitor housing part 19 that houses the LCD monitor 11. When the LCD monitor 11 is closed, being housed in the monitor housing part 19 (the state in FIG. 1A), the monitor housing part 19 is not exposed. When the LCD monitor 11 is opened (the state in FIG. 1B), the monitor housing part 19 is entirely exposed. Hereinafter, a direction parallel to the pivot Z1 is defined as the vertical direction. In regard to the horizontal direction of the image pickup apparatus 10, the right and the left sides are defined when the image pickup apparatus 10 is viewed from the rear side. A direction of an optical axis of the image pickup apparatus 10 is defined as the front-back direction.

The image pickup apparatus 10 includes a grip 20 at an end (right end) opposite to the pivot Z1. The grip 20 is held by a user when the image pickup apparatus 10 is in use. The grip 20 is formed by molding different materials, a resin part and an elastic part in an integrated manner. Using the elastic part in the outer surface helps a user to easily grasp and hold the grip 20. The grip 20 is provided with operation buttons 21 serving as operating members.

Figure 2:
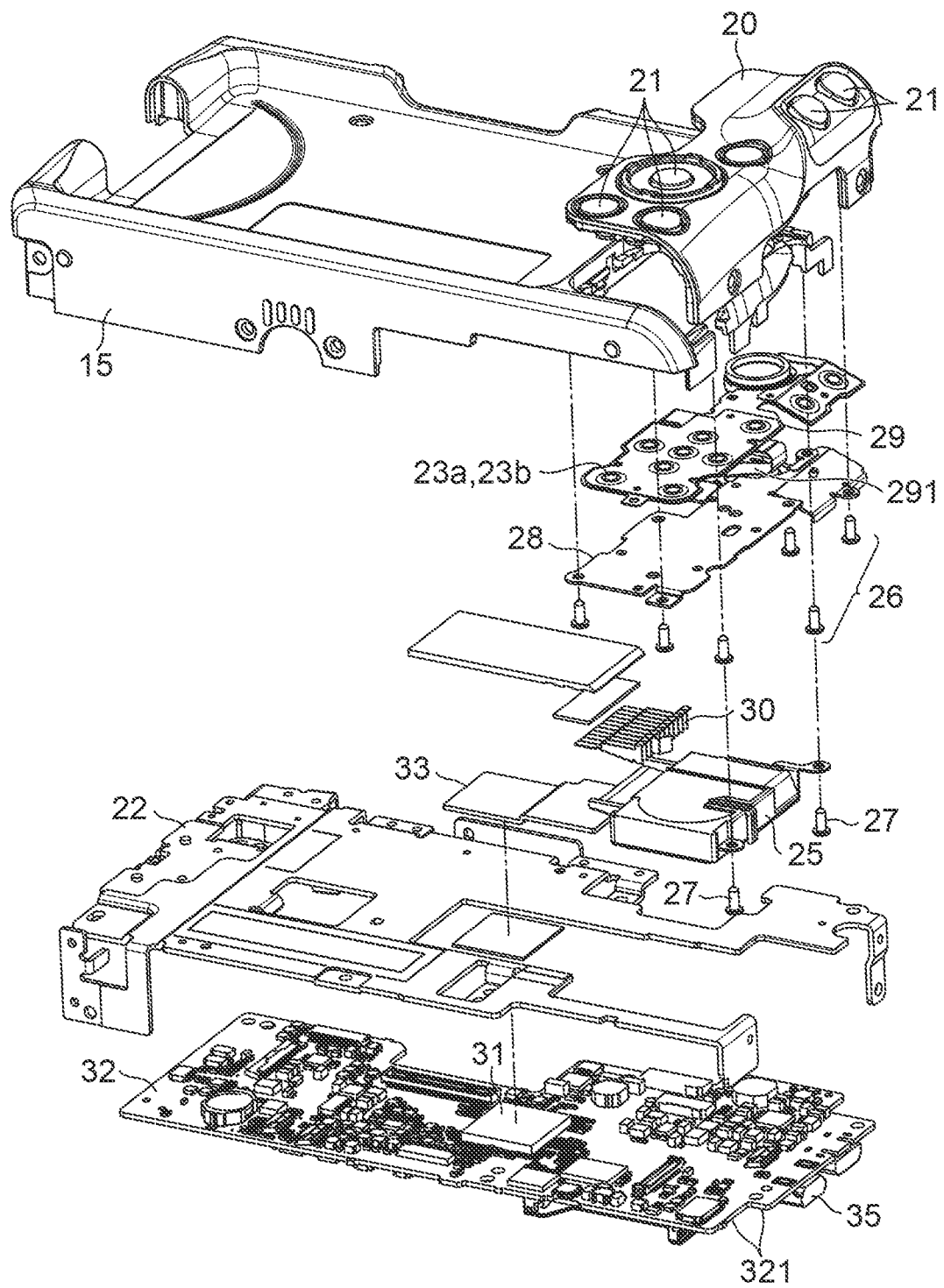
FIG. 2 is an exploded perspective view showing main parts of the image pickup apparatus including a cooling structure.

FIG. 2 is an exploded perspective view showing main parts of the image pickup apparatus 10 including the cooling structure. A cooling fan 25, a heat-exchange unit 30, and a heat-conductive unit 33 are main components of the cooling structure. The grip 20 is fixed to the rear cover 15 with fixing screws (not shown) in an integrated manner with the rear cover 15. A printed wiring board 29 serving as a wiring board is fixed to a base 28 through an adhesive sheet (not shown). A sheet switch 23b that holds a plurality of metal dome switches 23a in an integrated manner is fixed to the printed wiring board 29. When being pressed, each operation button 21 provided in the grip 20 pushes down the corresponding metal dome switch 23a and causes the printed wiring board 29 to output a signal.

The printed wiring board 29 is fixed to the base 28, and the base 28 is fixed to the rear cover 15 with screws 26. The cooling fan 25 is fixed with screws 27 to a fixing unit included in the grip 20. In this manner, the plurality of members are attached to the rear cover 15 of the image pickup apparatus 10 and form a unit. A main chassis 22 is a main structure of the image pickup apparatus 10. A control IC 31 which is a circuit element having a heating performance, is a main heat source. The control IC 31 is mounted on a main board 32 (board). The main board 32 is fastened to the main chassis 22 with fixing screws (not shown).

Figure 3A:
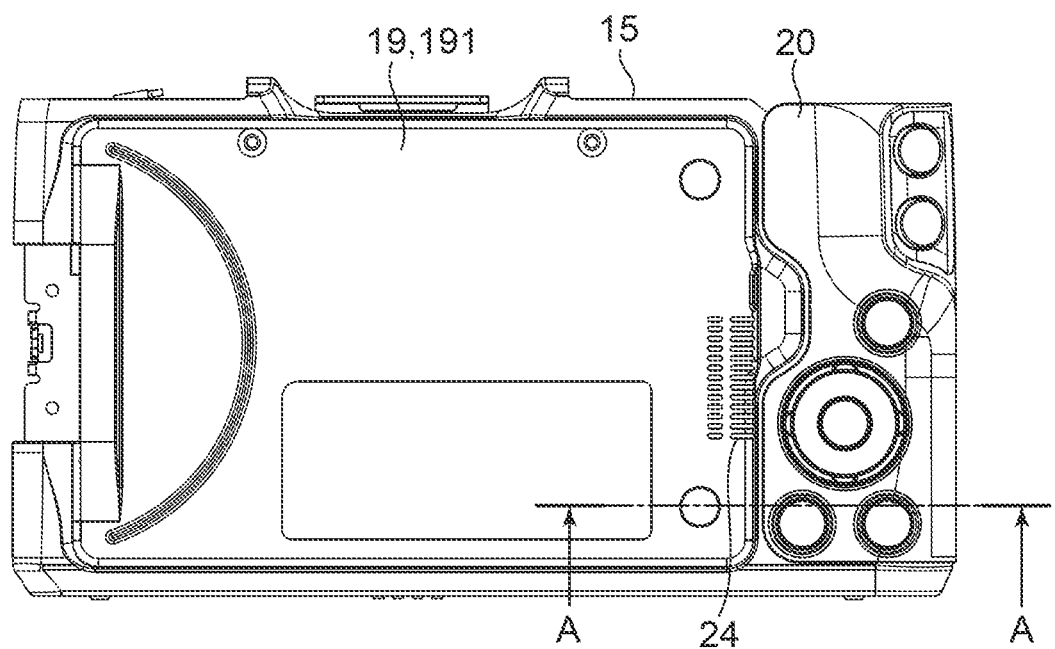
FIG. 3A is a rear view of the image pickup apparatus.
Figure 3B:
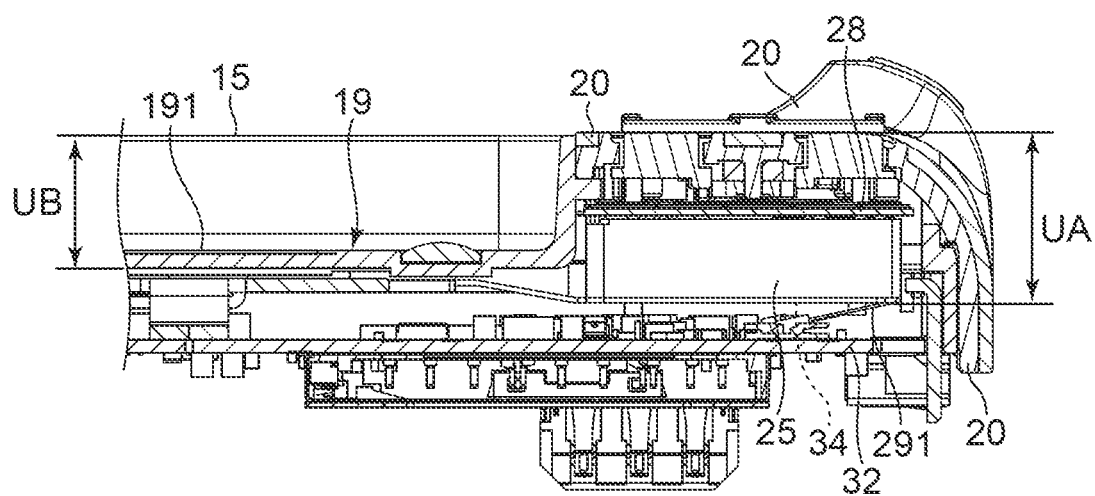
FIG. 3B is a cross-sectional view taken along the line A-A of FIG. 3A.

FIG. 3A is a rear view of the image pickup apparatus 10. FIG. 3B is a cross-sectional view taken along the line A-A in FIG. 3A. FIGS. 3A and 3B each shows a state in which the LCD monitor 11 removed. On a bottom surface 191 of the monitor housing part 19, a position close to the grip 20 is provided with one or more exhaust holes 24 that exhaust air passing through the heat-exchange unit 30. When the LCD monitor 11 is housed in the monitor housing part 19, the exhaust holes 24 are not exposed and are hardly viewed. Placing the exhaust holes 24 close to the heat-exchange unit 30 causes an improvement in exhaustive performance.

In the horizontal direction, a width of the cooling fan 25 is substantially equal to a width of the base 28. The cooling fan 25 is disposed within the projection of the grip 20 of the rear cover 15. Furthermore, the cooling fan 25 is disposed within the projection of the main board 32 being faced to each other. The cooling fan 25 is disposed between the main board 32 and the base 28 in a thickness direction (front-back direction) of the main board 32. This saves space in the thickness direction. Furthermore, the cooling fan 25 is disposed within a projected area of the base 28. A portion including the cooling fan 25, the base 28, and the grip 20 in a range overlapping with the cooling fan 25 in the front-back direction of the image pickup apparatus 10 has a thickness UA is substantially equal to a depth UB of the monitor housing part 19. Accordingly, the cooling fan 25 is housed in the main body of the image pickup apparatus 10 in a space-saving manner.

Figure 4A:
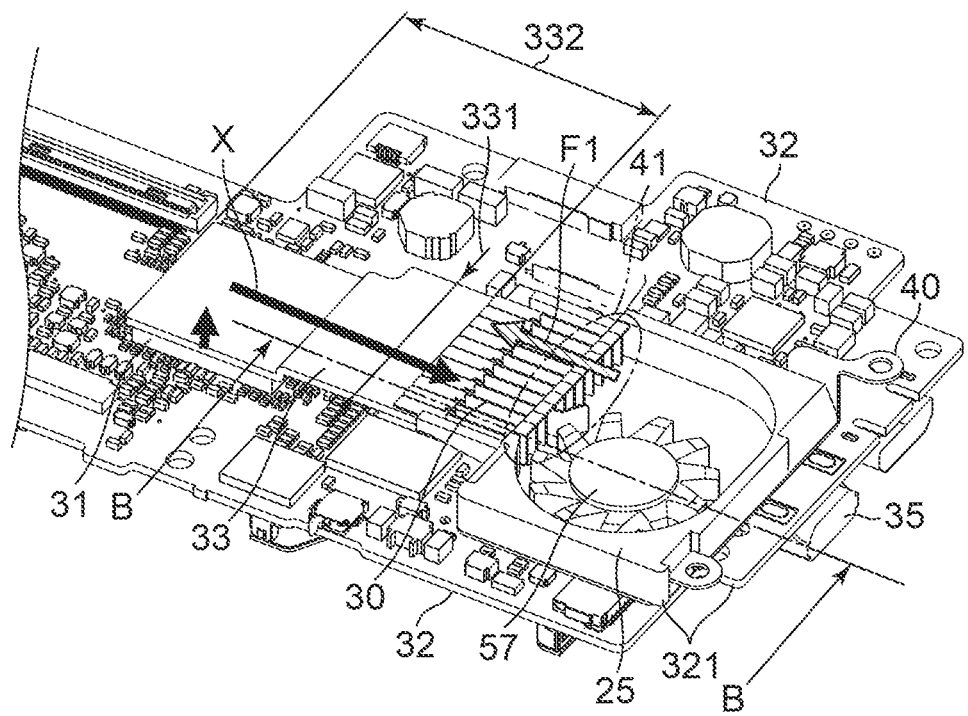
FIG. 4A is a perspective view of the cooling structure and the surrounds thereof.
Figure 4B:
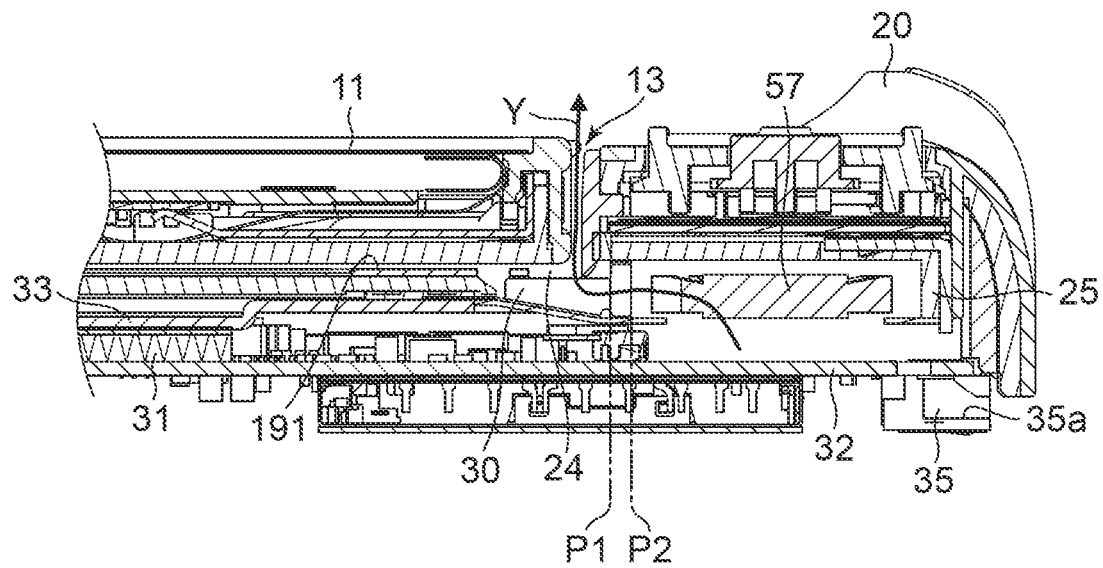
FIG. 4B is a cross-sectional view taken along the line B-B of FIG. 4A.

FIG. 4A is a perspective view of the cooling structure and the surrounds thereof. FIG. 4B is a cross-sectional view taken along the line B-B of FIG. 4A. One end of the heat-conductive unit 33 is thermally coupled to an upper surface of a package of the control IC 31, and the other end is thermally coupled to the heat-exchange unit 30. Accordingly, the control IC 31 and the heat-exchange unit 30 are thermally coupled by the heat-conductive unit 33. The heat of the control IC 31 is transmitted from the upper surface of the package of the control IC 31 to the heat-conductive unit 33. Since the control IC 31 which is a heat source, is at high temperature, the heat of the control IC 31 is transmitted rightward which is the X direction (direction indicated by the arrow in FIG. 4A), due to temperature gradients, then, transmitted up to the heat-exchange unit 30. The heat-exchange unit 30 is disposed close to a discharge port 41, receives air discharged from the discharge port 41, and radiates heat.

Blades 57 are provided within the cooling fan 25. The blades 57 are rotated around a pivot parallel in the front-back direction. The blades 57 are rotated to blow air towards the discharge port 41. Accordingly, air flows from the cooling fan 25 through the discharge port 41 to a discharging direction F1. The heat transmitted to the heat-exchange unit 30 is cooled and radiated by the blowing air from the cooling fan 25. The heat-exchange unit 30 being formed a duct-shaped has a plurality of fins and is fixed to the cooling fan 25 by adhesion or by welding. Specifically, the heat-exchange unit 30 is directly locked to the discharge port 41 of the cooling fan 25. Accordingly, space saving is achieved.

A side of the heat-conductive unit 33 in a direction substantially parallel to the X direction is a long side 332, and the other side which is perpendicular to the long side 332 is a short side 331. In a direction parallel to the short side 331, the center of the discharge port 41 of the cooling fan 25 substantially coincides with the center of the short side 331 of the heat-conductive unit 33. In other words, the duct shape of the heat-exchange unit 30 has a width substantially equal to an opening width of the discharge port 41.

As shown in FIG. 4B, the heat-exchange unit 30 partially enters inwards from the discharge port 41 into the cooling fan 25. In a direction parallel to the discharging direction F1, an end position P2, which is on the same side as the cooling fan 25, of the heat-exchange unit 30 is closer to the blades 57 than a position P1 of the discharge port 41. The heat-exchange unit 30 placed closer to the blades 57 enables heat exchange inside the discharge port 41, particularly, at a position where the airspeed is high. This arrangement improves the efficiency of heat exchange and leads to space-saving at the same time.

Focusing on the positional relationship between the control IC 31, the heat-exchange unit 30, and the cooling fan 25, those members are arranged in the following manner. First, note that the X direction is a direction of heat transfer from the control IC 31 to the heat-exchange unit 30. The discharging direction F1 is substantially parallel to the X direction. In the direction substantially parallel to the discharging direction F1 (or in the X direction), the heat-exchange unit 30 is placed between the control IC 31 and the cooling fan 25. The control IC 31 is placed lower than the discharge port 41 and is placed as an extension of the discharging direction F1 of air discharged from the cooling fan 25 with respect to the discharge port 41. Accordingly, the direction of heat transfer and the direction of air flow are opposite in vector. Thus, the layout of the cooling fan 25 contributes to the downsizing of the apparatus.

The main board 32 is provided with a cutout 321 (FIG. 2, FIG. 4A). The cutout 321 is provided at a position overlapping with the cooling fan 25 on the projection. The cutout 321 also functions as a ventilation unit. The cooling fan 25 primarily takes in air through the main board 32. Meanwhile, the cutout 321 also enables the cooling fan 25 to take in air through the opposite side of a side facing the main board 32. It should be noted that a through hole may be provided in the main board 32 in place of or in addition to the cutout 321 as a ventilation unit that has the same effect as the cutout 321.

Furthermore, the main board 32 includes a connector 35 which is an interface with the outside (FIGS. 2, 4A, and 4B). The connector 35 is covered with a mobile terminal cover 14 on the right side of the image pickup apparatus 10 (FIGS. 1A and 1B). The connector 35 includes an opening 35a that communicates with the inside and the outside of the image pickup apparatus 10 (FIG. 4B). This arrangement enables the cooling fan 25 to take in air through the opening 35a, which leads to space-saving. In addition, the connector 35 is disposed at a position overlapping with the cooling fan 25 on the projection. Accordingly, because a distance between the cooling fan 25 and the opening 35a becomes short, this arrangement improves efficiency of intake air and increases the rate of intake air volume from the outside, which effectively prevents a temperature rise inside the apparatus.

The air discharged in the discharging direction F1 by the rotation of the blades 57 of the cooling fan 25 passes through the heat-exchange unit 30. Cooling the heat-exchange unit 30 warms the air passing through the heat-exchange unit 30, therefore, it is necessary to promptly exhaust the air outside the apparatus to prevent a temperature rise inside the apparatus. As shown in FIG. 4B, while the LCD monitor 11 is housed (closed) in the monitor housing part 19, a gap 13 is generated between a free end of the LCD monitor 11 and a wall of the monitor housing part 19. Since this gap 13 communicates with the exhaust hole 24, exhaustive performance is secured even when the LCD monitor 11 is housed inside the monitor housing part 19. Accordingly, the air passing through the heat-exchange unit 30 flows towards the Y direction (rearward) through the exhaust hole 24 and the gap 13, and the air is exhausted to the outside.

Figure 5A:
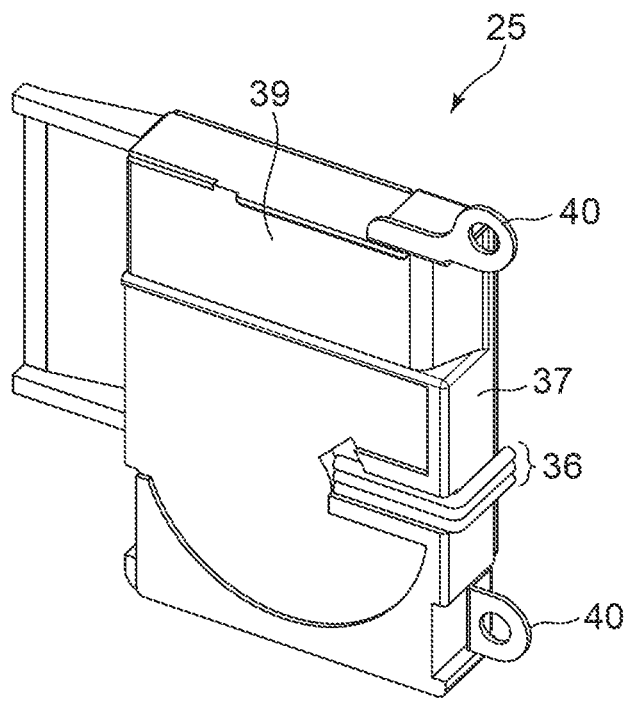
FIG. 5A is a perspective view of a cooling fan viewed from a printed wiring board.
Figure 5B:
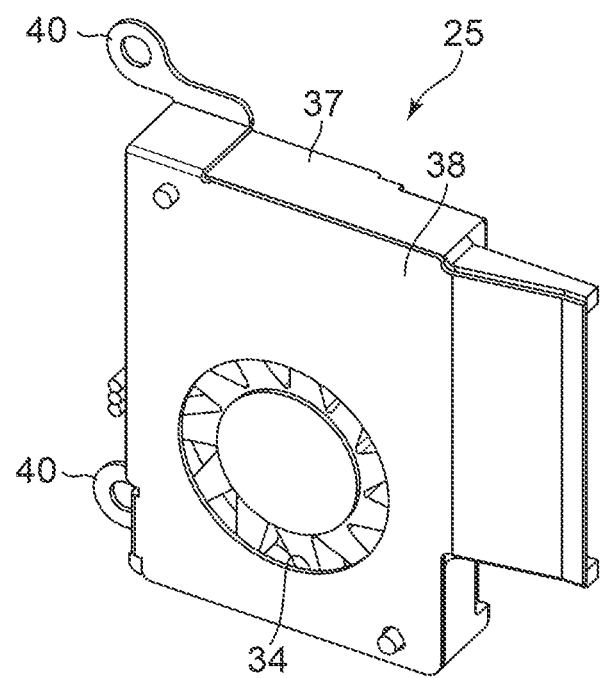
FIG. 5B is a perspective view of the cooling fan viewed from a main board.

FIG. 5A is a perspective view of the cooling fan 25 viewed from the printed wiring board 29. 5B is a perspective view of the cooling fan 25 viewed from the main board 32. A housing of the cooling fan 25 includes a first case 37 and a second case 38. A wiring member 36 for driving a motor that rotates the cooling fan 25 is drawn out from an opening of the first case 37. A recess 39 is provided on an outer surface of the first case 37. The recess 39 is lower than the surrounding surfaces. From the printed wiring board 29, a connection unit 291 (FIGS. 3B and 2) is extended to be electrically connected to the main board 32. While the printed wiring board 29 and the cooling fan 25 are assembled, the connection unit 291 which is part of the printed wiring board 29, is housed in the recess 39. This arrangement avoids the expansion of the cooling fan 25 in the thickness direction.

The second case 38 is provided with a fastening unit 40 which fastens the second case 38 to the rear cover 15. In addition, the second case 38 is provided with an open inlet 34. As shown in FIG. 3B, the inlet 34 of the cooling fan 25 is within the projection of the main board 32 and faces the main board 32. A dedicated inlet hole is not provided in the exterior of the image pickup apparatus 10 at a position facing the inlet 34. Without an inlet hole in the exterior, it prevents entry of dust or the like into the apparatus from the outside of the housing when the cooling fan 25 takes in air.

According to the present embodiment, the control IC 31 which is a heating element, is placed as the extension of the discharging direction F1 with respect to the discharge port 41 of the cooling fan 25. Furthermore, in the direction substantially parallel to the discharging direction F1, the heat-exchange unit 30 is placed between the control IC 31 and the cooling fan 25. In other words, the direction of heat transfer and the direction of air flow are opposite in vector. This arrangement enables to simplify the shape of a heat-transfer path from the heat source to the heat-exchange unit 30. For example, it is not necessary to use an intricate and expensive heat-transfer member such as a heat pipe. Furthermore, since the heat-exchange unit 30 is placed between the control IC 31 and the discharge port 41 of the cooling fan 25, it enables to arrange the heat-exchange unit 30 without making a heat dissipation path intricate. Accordingly, it enables to achieve efficient cooling in a space-saving manner.

In addition, since the exhaust hole 24 is provided in the bottom surface 191 of the monitor housing part 19, the exhaust hole 24 is less likely to be covered by a user's hand even when the LCD monitor 11 is housed (closed). Furthermore, since the gap 13 is secured even when the LCD monitor 11 is housed inside the monitor housing part 19, the exhaust path is less likely to be blocked. What is more, providing the exhaust hole 24 close to the heat-exchange unit 30 leads to high exhaustive performance.

At a position overlapping with the cooling fan 25 on the projection, the main board 32 is provided with the cutout 321 and the connector 35 that includes the opening 35a communicating with the outside. Since the air is taken into the cooling fan 25 through the cutout 321 and the opening 35a, it enables to increase the rate of intake air volume from the outside in a space-saving manner, which enhances the cooling efficiency. In addition, the heat-exchange unit 30 partially enters inwards from the discharge port 41 into the cooling fan 25 from the discharge port 41. Accordingly, enhancing the cooling efficiency is achieved.

The cooling fan 25 is disposed within the projected area of the base 28 and is disposed between the main board 32 and the base 28 in the thickness direction of the main board 32. Furthermore, the connection unit 291, which is part of the printed wiring board 29, is housed in the recess 39. These arrangements lead to the achievement of space-saving.

Although the exhaust hole 24 herein is provided in the monitor housing part 19, it should be noted that a movable component housed in a housing part provided with the exhaust hole 24 may be a component other than the LCD monitor 11.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-116290, filed Jun. 19, 2018, which is hereby incorporated by reference herein in its entirety.

What is claimed is:

1. An electronic apparatus comprising:
   one or more exhaust holes provided in a cover of the electronic apparatus;
   a board on which a heating element is mounted;
   a fan including a discharge port;
   a heat-exchange unit configured to receive air discharged from the discharge port of the fan and radiate heat; and
   a heat-conductive unit configured to thermally couple the heating element and the heat-exchange unit,
   wherein the heating element is placed as an extension of a discharging direction of the air from the fan with respect to the discharge port of the fan,
   wherein the heat-exchange unit is placed between the heating element and the fan in a direction substantially parallel to the discharging direction,
   wherein the heat-conductive unit includes a long side extending in the direction substantially parallel to the discharging direction and a short side extending in a direction perpendicular to the direction substantially parallel to the discharging direction,
   wherein the heat-exchange unit has a duct shape including a plurality of fins having long sides extending in the direction substantially parallel to the discharging direction so as to lead air discharged from the discharge port to the one or more exhaust holes,
   wherein in the direction perpendicular to the direction substantially parallel to the discharging direction, a width of the duct shape of the heat-conductive unit is substantially equal to an opening width of the discharge port, wherein the discharge port and the short side of the heat-conductive unit are disposed to face each other in the direction substantially parallel to the discharging direction, and wherein in the direction perpendicular to the direction substantially parallel to the discharging direction, a center of the discharge port substantially coincides with a center of the short side of the heat-conductive unit.

2. The electronic apparatus according to claim 1 further comprising:

a wiring board provided with an operating member; and
a base on which the wiring board is fixed,
wherein the fan is disposed within a projected area of the base.

3. The electronic apparatus according to claim 2,
wherein the fan is disposed between the board and the base in a thickness direction of the board.

4. The electronic apparatus according to claim 2,
wherein a recess is provided on a housing of the fan, and the wiring board is partially housed in the recess.

5. The electronic apparatus according to claim 1,
wherein the board is provided with a ventilation unit, which includes a cutout or a through hole, at a place overlapping with the fan on a projection, and
air is taken into the fan through the ventilation unit.

6. The electronic apparatus according to claim 1,
wherein the heat-exchange unit is directly engaged with the discharge port.

7. The electronic apparatus according to claim 1,
wherein the heat-exchange unit partially enters inwards from the discharge port into the fan.

8. The electronic apparatus according to claim 1 further comprising:

an electronic apparatus body;
a movable component configured to move relative to the electronic apparatus body; and
a housing part configured to house the movable component,
wherein the housing part is provided with an exhaust hole that exhausts air discharged from the fan to an outside.

9. The electronic apparatus according to claim 8,
wherein, when the movable component is housed inside the housing part, a gap generated between the electronic apparatus body and the housing part communicates with the exhaust hole.

10. The electronic apparatus according to claim 8,
wherein the exhaust hole is provided close to the heat-exchange unit.

11. The electronic apparatus according to claim 1,
wherein the board is provided with a connector, which includes an opening that communicates with an outside, at a place overlapping with the fan on a projection, and air is taken into the fan through the connector.

12. The electronic apparatus according to claim 11,
wherein the electronic apparatus is an image pickup apparatus.

* * * * *